United States Patent

Okazaki et al.

[11] Patent Number: 5,850,683
[45] Date of Patent: Dec. 22, 1998

[54] COMPONENT MOUNTING APPARATUS

[75] Inventors: Tadao Okazaki; Yongsik Won, both of Shizuoka, Japan

[73] Assignee: Samsung Aerospace Industries, Ltd., Kyongsangnam-do, Rep. of Korea

[21] Appl. No.: 787,048

[22] Filed: Jan. 28, 1997

[30] Foreign Application Priority Data

Jan. 29, 1996 [JP] Japan .................................. 8-012607

[51] Int. Cl.⁶ ............................ H05K 3/30; H05K 13/04
[52] U.S. Cl. ................................ 29/740; 29/743; 29/834; 29/DIG. 44; 294/64.1
[58] Field of Search ............................ 29/740, 741, 743, 29/834, DIG. 44; 294/2, 64.1; 414/737, 752

[56] References Cited

U.S. PATENT DOCUMENTS

| | | | |
|---|---|---|---|
| 4,307,832 | 12/1981 | Taki et al. | 29/740 X |
| 4,515,507 | 5/1985 | Asai et al. | 294/64.1 X |
| 4,759,124 | 7/1988 | Snyder et al. | 29/743 X |
| 4,787,137 | 11/1988 | Jeanmairet et al. | 29/741 X |
| 4,860,438 | 8/1989 | Chen | 29/740 |
| 5,195,235 | 3/1993 | Mifuji | 29/743 X |
| 5,628,107 | 5/1997 | Nushiyama et al. | 29/740 |
| 5,692,293 | 12/1997 | Igarashi et al. | 29/DIG. 44 X |

FOREIGN PATENT DOCUMENTS 5021997  1/1993  Japan ................................ 29/743

*Primary Examiner*—Peter Vo
*Attorney, Agent, or Firm*—Finnegan, Henderson, Farabow, Garrett & Dunner, L.L.P.

[57] ABSTRACT

A component mounting apparatus includes an eccentric cam installed to rotate counterclockwise or clockwise with respect to a holder of a mounting head, and a follower connected to a suction bit and contacting a surface of the eccentric cam. Rotating the eccentric cam by a predetermined degree moves the follower which, in turn, moves the suction bit up and down. The shape of the surface of the eccentric cam is designed such that the upward-movement speed of the suction bit is different from the downward-movement speed of the suction bit due to the rotation of the eccentric cam. The shape of the surface of the eccentric cam is such that the suction bit moves slowly downward and then rapidly upward when the eccentric cam rotates in one direction, and moves rapidly downward and then slowly upward when the eccentric cam rotates in the other direction.

10 Claims, 8 Drawing Sheets

COMPONENT MOUNTING APPARATUS

BACKGROUND OF THE INVENTION

The present invention relates to a component mounting apparatus for automatically mounting electronic components, such as semiconductor devices, on a printed circuit board.

A component mounting apparatus, such as a chip mounter, automatically mounts electronic components, such as IC or LSI semiconductor devices, diodes, condensers, or resistors, on a printed circuit board. The component mounting apparatus includes guide rails that function as a board supporting stage for guiding the printed circuit board to a predetermined position, a component stage for supporting the various components to be mounted on the printed circuit board, and a mounting head which moves in a plane according to X-Y coordinates to transfer the electronic components supported by the component stage to the printed circuit board for mounting.

The mounting head includes suction bits for picking up electronic components using vacuum pressure. The suction bits are installed in the mounting head to move up and down with respect to both the board supporting stage and the component stage.

The component mounting apparatus uses an electric motor or an air pressure cylinder to move a suction bit up and down. Using an electric motor to move the suction bit allows the movement speed of the suction bit to be controlled, but increases the manufacturing cost of the mounting head.

Using an air pressure cylinder to move the suction bit up and down, on the other hand, reduces manufacturing costs, but does not permit the vertical moving speed of the suction bit to be accurately controlled. Furthermore, because the suction bit connects to a piston rod of the air pressure cylinder, a linear movement of the piston rod results in a vertical movement of the suction bit. The component mounting efficiency can be increased by increasing the vertical movement speed of the piston rod. However, this impacts the reciprocating ends of the position rod, thus limiting increases in the movement speed of the piston rod.

SUMMARY OF THE INVENTION

To overcome the above problems, the present invention provides an improved component mounting apparatus that rapidly moves a simplified suction bit.

The present invention also provides an improved component mounting apparatus that moves a suction bit up and down at different speeds.

To achieve the above objects, there is provided a component mounting apparatus for mounting a component in a component stage on a printed circuit board. The component mounting apparatus includes a mounting head movably installed between the component stage and the printed circuit board, a holder attached to the mounting head, a suction bit attached to the holder for picking up and mounting the component, an eccentric cam rotatably attached to the holder; an element for rotating the eccentric cam, and a follower connected to the suction bit and contacting the surface of the eccentric cam. The follower moves the suction bit up and down when the eccentric cam is rotated by a predetermined degree by the eccentric cam rotating element.

The eccentric cam rotating element includes a rack member installed to move linearly with respect to the holder. When the rack member moves linearly in one direction, the eccentric cam rotates by the predetermined degree. When the eccentric cam rotates by the predetermined degree, the eccentric cam moves the suction bit between an uppermost position and a lowermost position. The predetermined degree is preferably 180° or 360°.

The shape of the surface of the eccentric cam is designed such that the upward-movement speed of the suction bit is different from the downward-movement speed of the suction bit due to the rotation of the eccentric cam. The shape of the surface of the eccentric cam is such that the suction bit moves slowly downward and then rapidly upward when the eccentric cam rotates in one direction, and moves rapidly downward and then slowly upward when the eccentric cam rotates in the other direction.

The holder is installed in the mounting head to move up and down to vary the vertical movement range of the suction bit.

BRIEF DESCRIPTION OF THE DRAWINGS

The accompanying drawings, which are incorporated in and constitute a part of this specification, illustrate an embodiment of the invention and, together with the description, explain the objects, advantages and principles of the invention. In the drawings.

DETAILED DESCRIPTION OF THE INVENTION

The following detailed description of the invention refers to the accompanying drawings that illustrate preferred embodiments consistent with the principles of this invention. Other embodiments are possible and changes may be made to the embodiments without departing from the spirit and scope of the invention. The following detailed description does not limit the invention. Instead, the scope of the invention is defined only by the appended claims.

Figure 1:
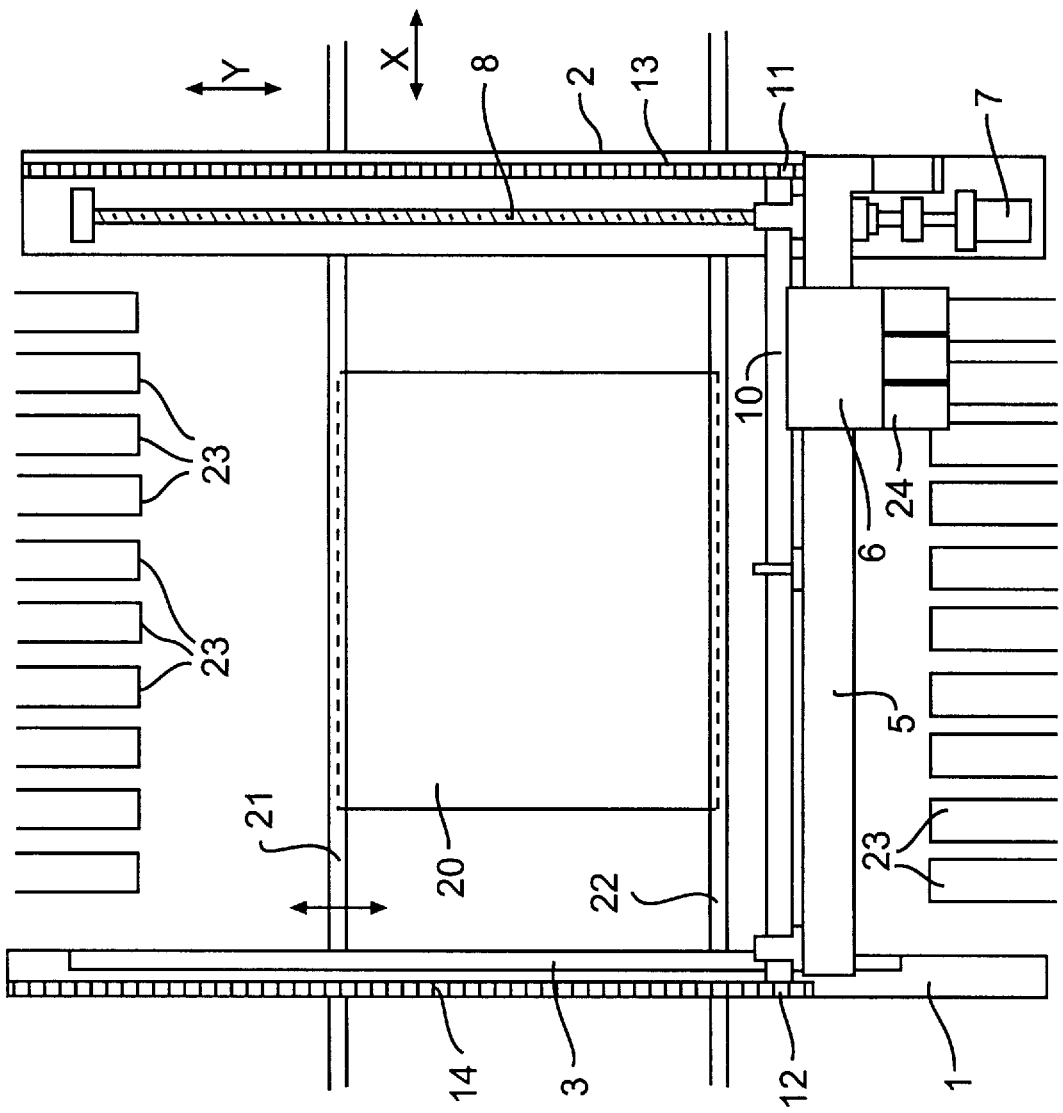
FIG. 1 shows a plan view of a component mounting apparatus according to the principles of the present invention.
Figure 2:
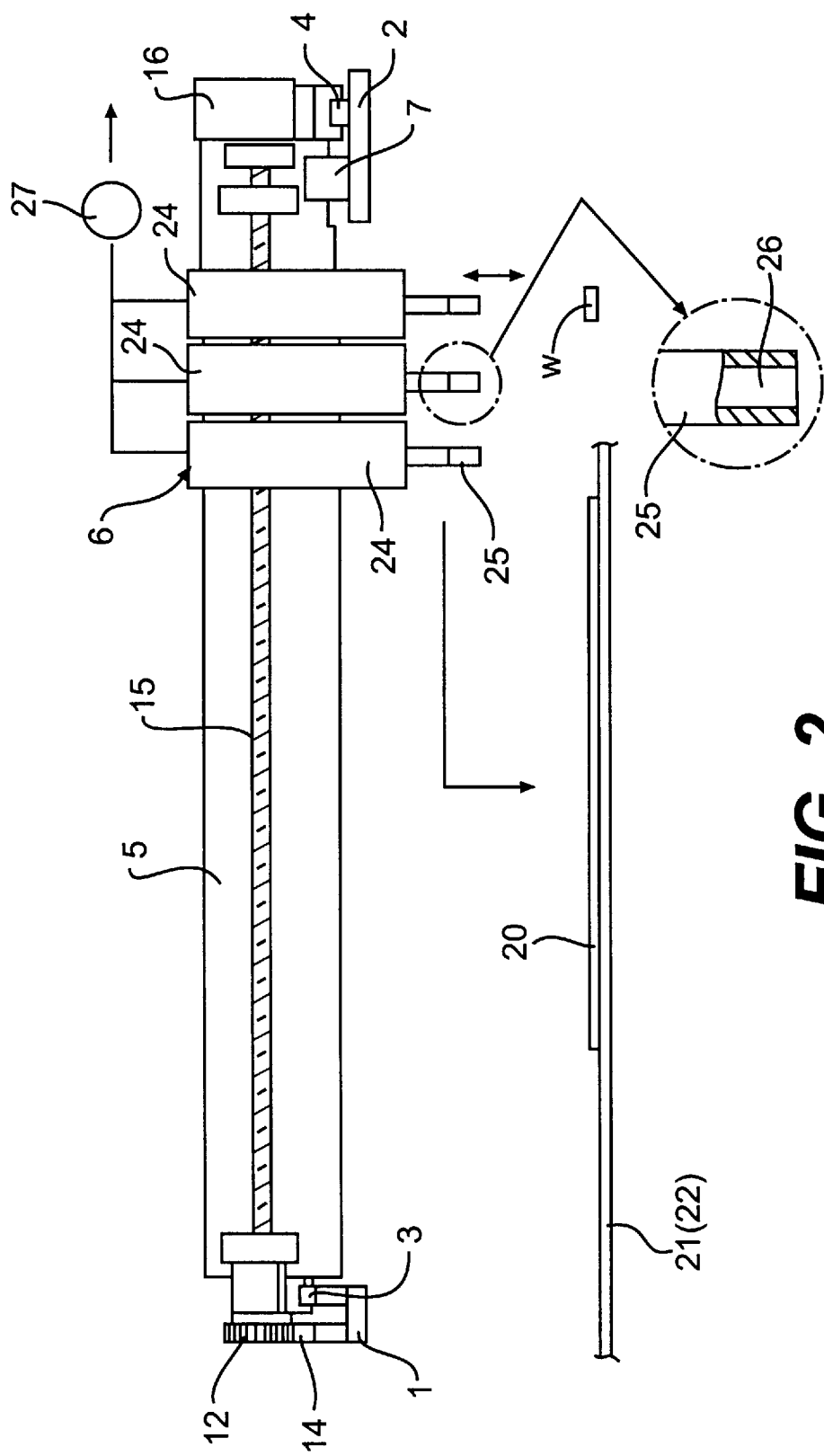
FIG. 2 shows a front view of the component mounting apparatus shown of FIG. 1.

FIGS. 1 and 2 show a component mounting apparatus consistent with the principles of the present invention. The component mounting apparatus includes a pair of horizontal supporting members 1 and 2 disposed in parallel to each other, and guide rails 3 and 4 connected to horizontal supporting members 1 and 2, respectively.

Cross-bar 5 has end portions respectively coupled to guide rails 3 and 4, such that cross-bar 5 moves on guide rails 3 and 4 in the Y-axis direction along horizontal supporting members 1 and 2. Head unit 6 is slidably coupled to cross-bar 5 to move in the X-axis direction along cross-bar 5.

Motor 7 drives ball screw 8, which is rotatably connected to horizontal supporting member 2, to move cross-bar 5 in the Y-axis direction along horizontal supporting members 1 and 2. Ball screw 8 includes a screw connected to an end portion of cross-bar 5.

Interlocking shaft 10 attaches in parallel to cross-bar 5. Pinions 11 and 12, connected to both ends of interlocking shaft 10, engage with racks 13 and 14, respectively. Racks 13 and 14, in turn, couple to horizontal supporting members 1 and 2, respectively. In this way, when motor 7 drives ball screw 8, cross-bar 5 moves in the Y-axis direction and pinions 11 and 12 rotate along racks 13 and 14. Rack 13 is positioned over guide rail 4 shown in FIG. 2.

Ball screw 15 rotatably connects to cross-bar 5 to move head unit 6 along its axis in the X-axis direction. A timing belt traveling over a pulley (not shown) installed on the main shaft of motor 16 and a pulley (not shown) installed on ball screw 15 drives ball screw 15.

The component mounting apparatus includes a pair of guide members 21 and 22 installed in parallel under horizontal supporting members 1 and 2 and extending perpendicularly with respect thereto. Guide members 21 and 22 form a conveyer for transporting printed circuit board 20 in the X-axis direction. Guide member 21 advances toward and retreats from guide member 22, according to the size of printed circuit board 20.

Several component stages 23, positioned on both sides of the conveyer formed by guide members 21 and 22, support electronic components W. Several mounting heads 24 included on head unit 6 mount the electronic components W from each component stage 23 onto printed circuit board 20.

FIG. 2 shows mounting head 24 includes suction bit 25, that is, a suction nozzle that moves up and down. Suction bit 25 picks up an electronic component W from component stage 23 and mounts the component at a predetermined position on printed circuit board 20 as cross-bar 5 moves along horizontal supporting members 1 and 2 in the Y-axis direction (FIG. 1), and mounting head 24 simultaneously moves along cross-bar 5 in the X-axis direction.

To pick up the electronic component W, suction bit 25 first moves downward and toward a predetermined component stage 23. Suction bit 25 includes hollow hole 26 connected to vacuum pump 27. Vacuum pressure provided from vacuum pump 27 to hollow hole 26 allows suction bit 25 to pick up the electronic component W and hold it against the leading end of suction bit 25.

Once suction bit 25 picks up the electronic component W, suction bit 25 moves upward and toward the predetermined position on printed circuit board 20. Thereafter, suction bit 25 moves downward toward printed circuit board 20 to mount the electronic component W at the predetermined position.

Figure 3:
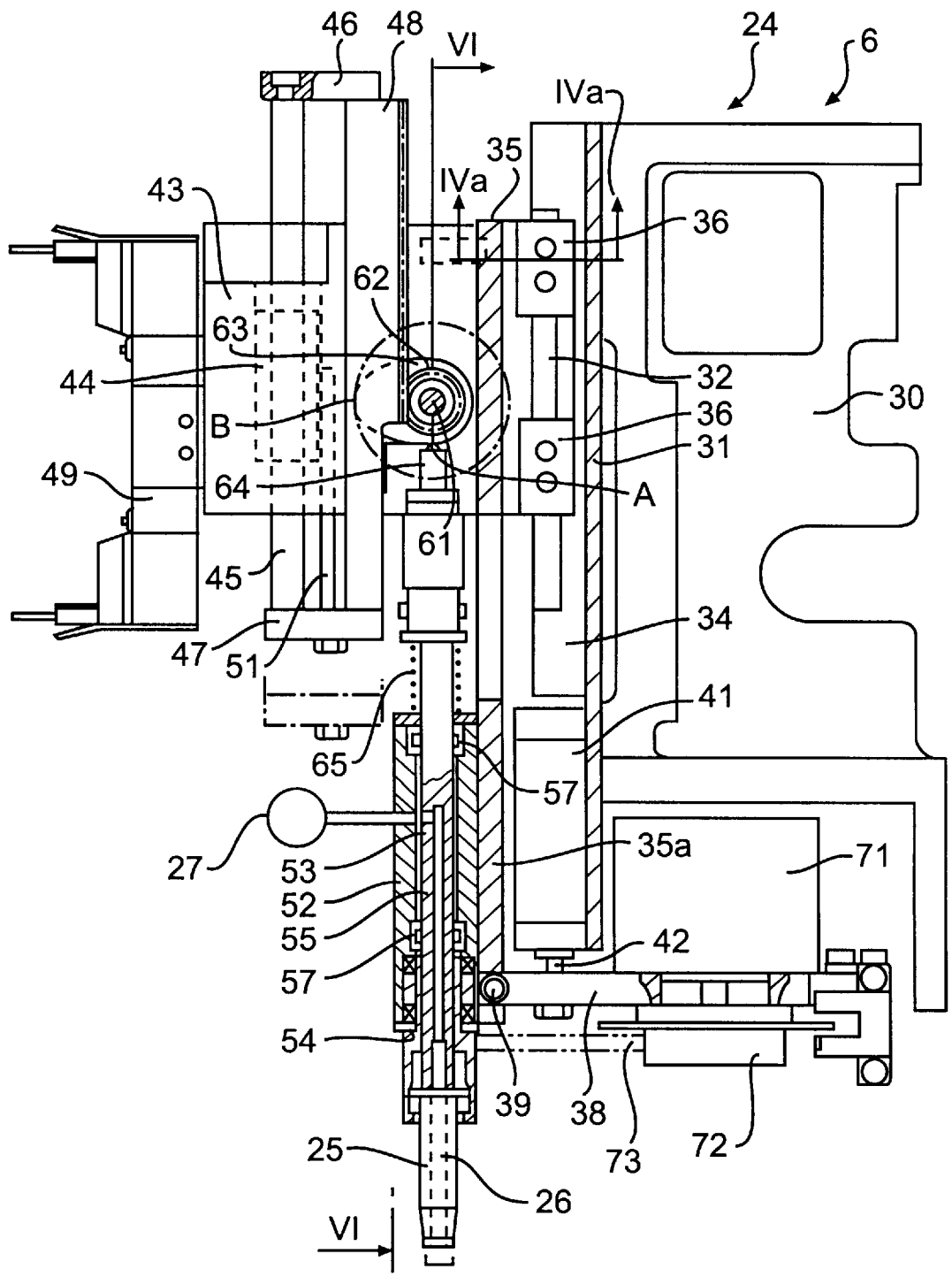
FIG. 3 shows a detailed sectional front view of a mounting head shown in FIGS. 1 and 2.

FIGS. 3 through 7 show the elements of mounting head 24. Supporting plate 31 in combination with base 30 form head unit 6. FIGS. 3, 4A, and 4B show that supporting plate 31 connects to supporting block 34 and has a pair of vertically-extended guide rails 32 and 33. Holder 35 includes sliding blocks 36 and 37 that slide vertically along guide rails 32 and 33.

Figure 4A:
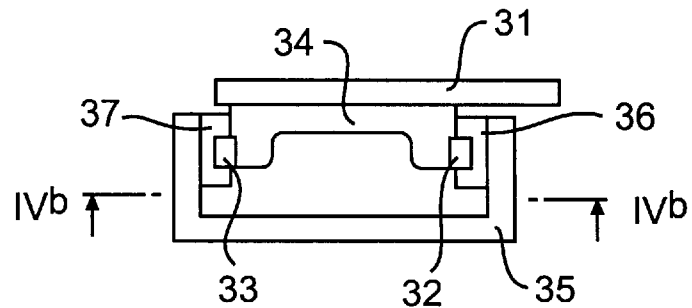
FIG. 4A shows a sectional view taken along line IVa—IVa in FIG. 3.
Figure 4B:
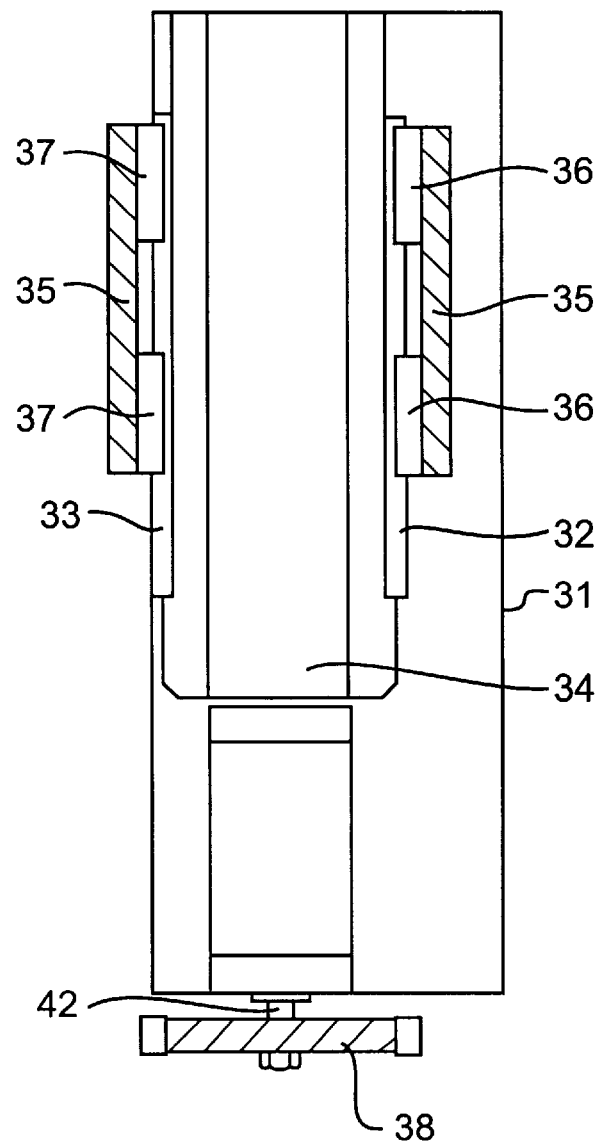
FIG. 4B shows a sectional view taken along line IVb—IVb in FIG. 4A.

Bolt 39 connects lower portion 35a of holder 35 to horizontal bracket 38. FIG. 4B shows that horizontal bracket 38 connects to rod 42 of air pressure cylinder 41. Air pressure cylinder 41 couples to supporting plate 31 and operates to move holder 35 up and down along guide rails 32 and 33. By such an arrangement, the uppermost (lowermost) position of suction bit 25 can be changed by varying the vertical position of holder 35 in a manner discussed below.

Driving blocks 43 connect to holder 35 by screws and include several air pressure chambers 44 that extend vertically within driving blocks 43. Each air pressure chamber 44 includes upper and lower pressure chambers (not shown). Compressed air supplied to each air pressure chamber 44 drives piston rods 45 to move upward and downward with respect to driving blocks 43.

Connecting members 46 and 47, that connect to piston rod 45 by screws, couple piston rod 45 to rack member 48. When compressed air is supplied to the lower pressure chamber of air pressure chamber 44, piston rod 45, together with rack member 48, moves up. When compressed air is supplied to the upper pressure chamber of air pressure chamber 44, on the other hand, piston rod 45, together with rack member 48, moves down. FIG. 3 shows rack member 48 at its uppermost position.

Guide rod 51 connects to lower connecting member 47 in such a way as to be slidably inserted into a guide hole formed in driving block 43. Guide rod 51 directs rack member 48 in its upward and downward motions.

Figure 5:
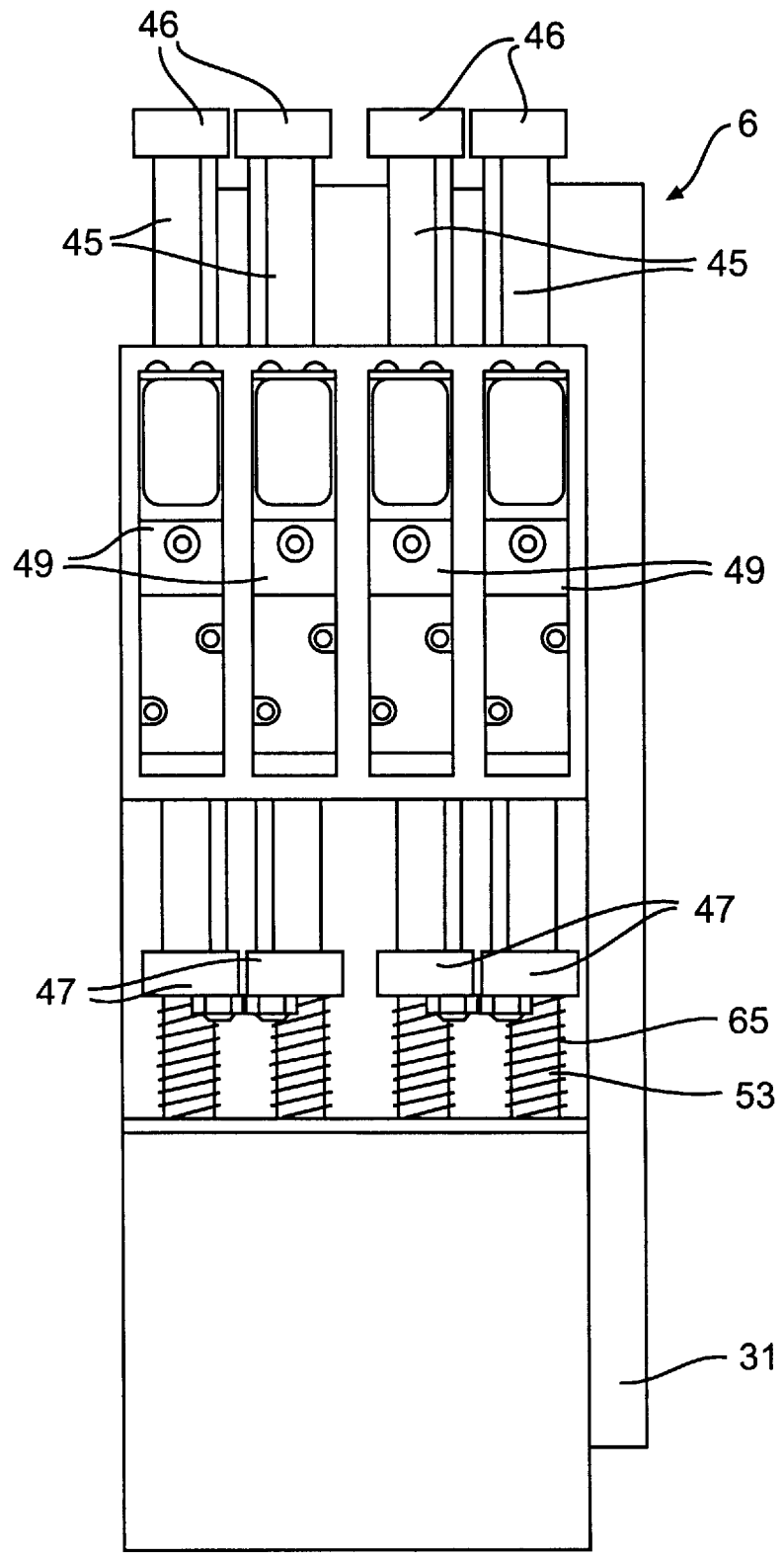
FIG. 5 shows a left-side view of the mounting head of FIG. 3.

FIG. 5 shows driving block 43 includes electronic valves 49 to control the supply of compressed air to the upper and lower pressure chambers of air pressure chamber 44.

Figure 6:
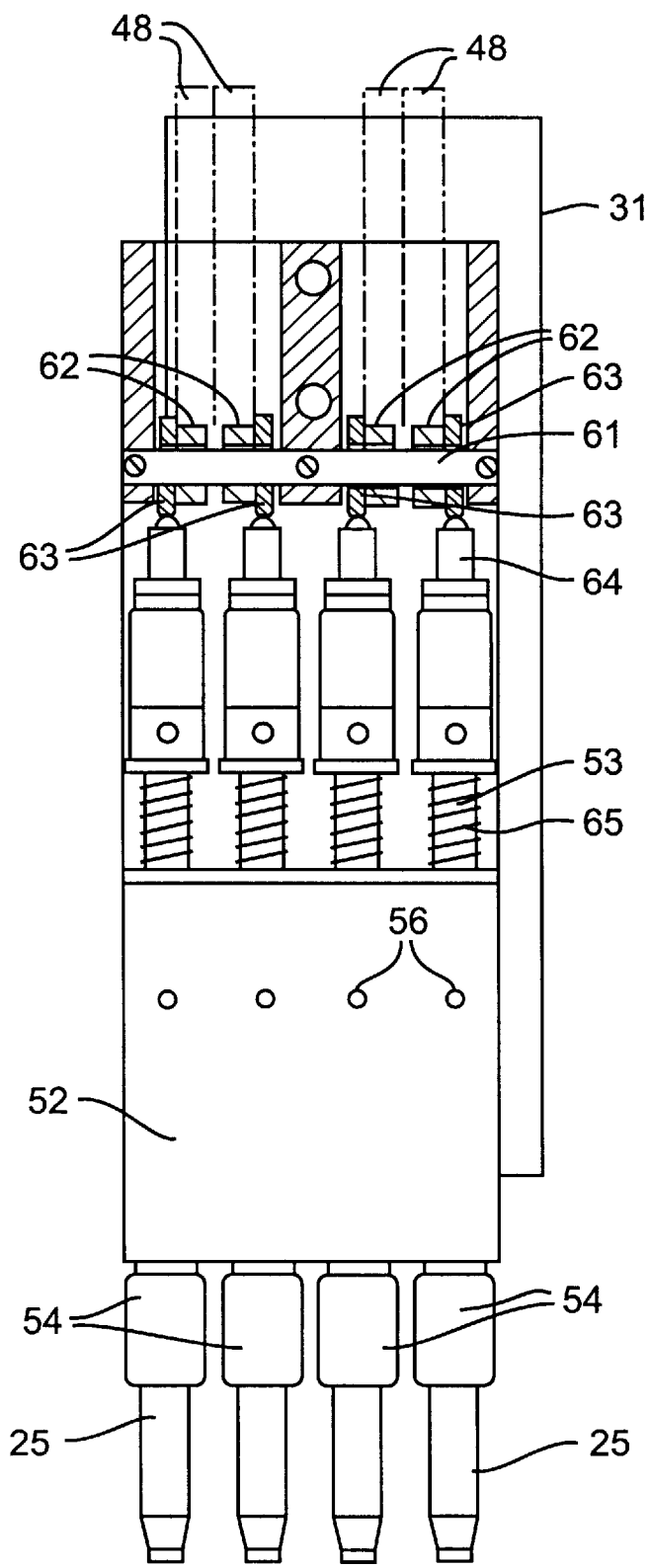
FIG. 6 shows a sectional view taken along line VI—VI in FIG. 3.

FIG. 6 shows nozzle supporting block 52 attached to lower portion 35a of holder 35. Nozzle supporting block 52 includes several spindles 53 that slide up and down, and nozzle holders 54 that rotatably connect around the lower end portions of spindles 53 under nozzle supporting block 52 using bearings.

Each nozzle holder 54 has a suction bit 25 that moves up and down to pick up an electronic component W. Nozzle holder 54 prevents suction bit 25 from rotating relative to nozzle holder 54. When spindles 53 move downward, suction bit 25 simultaneously moves downward, protruding from nozzle holder 54. Similarly, when spindles 53 move upward, suction bit 25 simultaneously moves upward, returning to its original location.

Suction bits 25 do not directly connect to spindles 53, but a spring (not shown) interposed between the upper ends of suction bit 25 and the lower ends of spindle 53 provides the connection. Thus, when spindle 53 begins to move downward from its uppermost position, only spindle 53 moves. After spindle 53 moves a predetermined distance, suction bit 25 moves downward against the elastic force of the spring interposed therebetween.

FIG. 3 shows that spindles 53 have suction holes 55 connected to hollow holes 26 of suction bits 25. Hollow holes 26 connect to vacuum pump 27, such that vacuum pump 27 sucks ambient air from the openings of the leading ends of suction bits 25 to thereby enable suction bits 25 to pick up the electronic components W (FIG. 2). Sealing material 57, deposited between spindles 53 and nozzle supporting block 52, provides a seal therebetween.

FIGS. 3 and 6 show supporting shaft 61 connected horizontally to driving block 43 and having several pinions 62 rotatably installed to engage rack members 48. An eccentric cam 63 connects to each pinion 62. FIG. 3 shows that eccentric cam 63 has a minimum diameter portion A and a maximum diameter portion B.

Rack member 48 drives pinion 62 by moving each piston rod 45 up and down. Pinion 62, in turn, drives eccentric cam 63. Rack member 48 and pinion 62 each contain a number of teeth that engage each other. The number of teeth of rack member 48 and pinion 62 are such that pinion 62 rotates by 360° when rack member 48 completes one stroke between its uppermost and lowermost positions.

Follower 64 attaches to each spindle 53 by a screw and has contact to the outer circumferential surface, or cam surface, of each eccentric cam 63. Compression coil spring 65 installed between nozzle supporting block 52 and follower 64 exerts an elastic force upon follower 64, pressing follower 64 against the cam surface. As a result, by rotating eccentric cam 63, spindle 53 moves up and down, causing suction bit 25 to move up and down.

During one stroke of rise or fall of piston rod 45, eccentric cam 63 rotates once, or by 360°, which, in turn, moves suction bit 25 by two strokes. Therefore, suction bit 25 moves twice as fast as piston rod 45. Accordingly, because there is no need to increase the moving speed of piston rod 45, impacts at its uppermost and lowermost positions are prevented, resulting in an increased life span and a reduction of impact noise.

Figure 7:
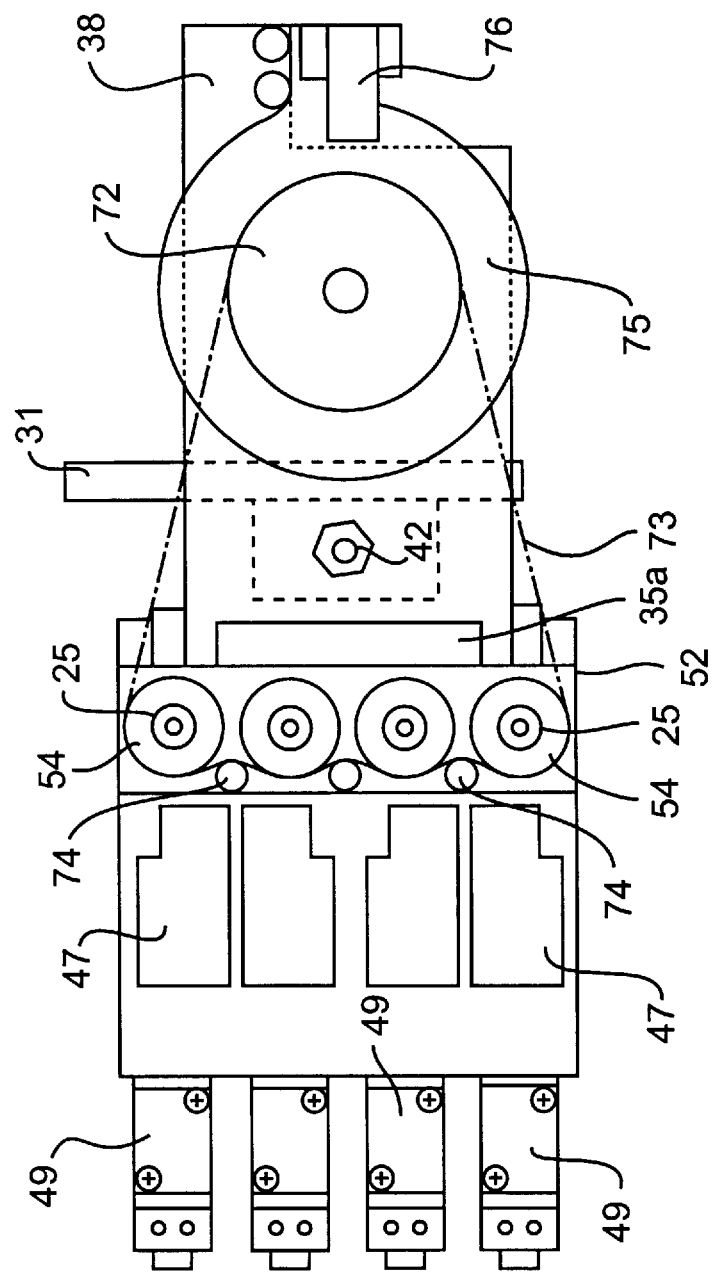
FIG. 7 shows a bottom view of the mounting head of FIG. 3.

FIG. 3 shows motor 71 attached to horizontal bracket 38. As FIG. 7 shows, timing belt 73 travels over pulley 72 connected to the main shaft of motor 71 and over each nozzle holder 54. Timing belt 73 makes contact with nozzle holders 54 and idle pulleys 74 located under nozzle supporting block 52. Timing belt 73 rotates nozzle holders 54 in the same direction. Rotation of nozzle holders 54 causes suction bits 25 to rotate accordingly. However, suction bits 25 do not rotate relative to nozzle holder 54.

FIG. 7 shows sensor 76 attached to horizontal bracket 38. Sensor 76 detects the rotational speed of nozzle holders 54. To facilitate such detection, disk 75 is placed on pulley 72.

The present invention does not limit the number of suction bits 25. The number of suction bits 25 could most appropriately be determined in accordance with requirements of the manufacturing process.

Furthermore, because each suction bit 25 may be operated separately in mounting head 24, this permits mounting head 24 to sequentially move to component stages 23 to thereby pick up different types of electronic components W using suction bits 25. As mounting head 24 arrives at each component stage 23, only one suction bit 25 would move up and down to pick up the electronic component W.

Next, the operation of mounting the electronic component W on printed circuit board 20 will be described.

First, holder 35 moves to its uppermost position with respect to supporting plate 31 (FIG. 3), using air pressure cylinder 41 attached to horizontal bracket 38. Piston rod 45 moves to its uppermost position with respect to holder 35. Then, mounting head 24 moves in the X-axis direction along cross-bar 5 (FIG. 1), which simultaneously moves in the Y-axis direction along guide rails 3 and 4. Mounting head 24 moves to a position such that suction bit 25 is positioned over the electronic component W (FIG. 2) of a predetermined component stage 23.

Once mounting head 24 reaches the predetermined component stage 23, piston rod 45 (FIG. 3) moves downward by operating electronic valve 49. The downward motion of piston rod 45 causes rack member 48 to rotate eccentric cam 63 counterclockwise. This results in follower 64 moving downward while contacting the minimum diameter portion A and then the maximum diameter portion B of eccentric cam 63 until suction bit 25 at its lowermost position comes into contact with the electronic component W. Suction bit 25 then picks up the component using the vacuum pressure from vacuum pump 27.

As follower 64 contacts the maximum diameter portion B and then the minimum diameter portion A of eccentric cam 63 in the same rotating direction, follower 64 moves upward, moving the electronic component W held by suction bit 25 upward. When rack member 48 moves to its lowermost position, eccentric cam 63 rotates once, or by 360°, and follower 64 returns to contact the original position at the minimum diameter portion A of eccentric cam 63. By such a procedure, suction bit 25 picks up the electronic component W from component stage 23.

Once suction bit 25 secures the electronic component W, holder 35 moves up and mounting head 24 moves horizontally to a predetermined position on printed circuit board 20. When mounting head 24 reaches the predetermined position on printed circuit board 20, piston rod 45 moves upward in the reverse order to that described above. The upward motion of piston rod 45 causes rack member 48 to rotate eccentric cam 63 in the reverse direction to that described above, or clockwise, which, in turn, moves suction bit 25 downward. Suction bit 25 at its lowermost position mounts the electronic component W on printed circuit board 20.

When moving mounting head 24 horizontally, air pressure cylinder 41 moves holder 35, and thereby suction bit 25, upward to avoid interference by relatively large components mounted high on printed circuit board 20. Of course when printed circuit board 20 contains no large components to interfere with the horizontal movement of mounting head 24, there is no need to move holder 35 upward. That is, mounting head 24 can move horizontally simply by moving suction bit 25 up and down.

Figure 8B:
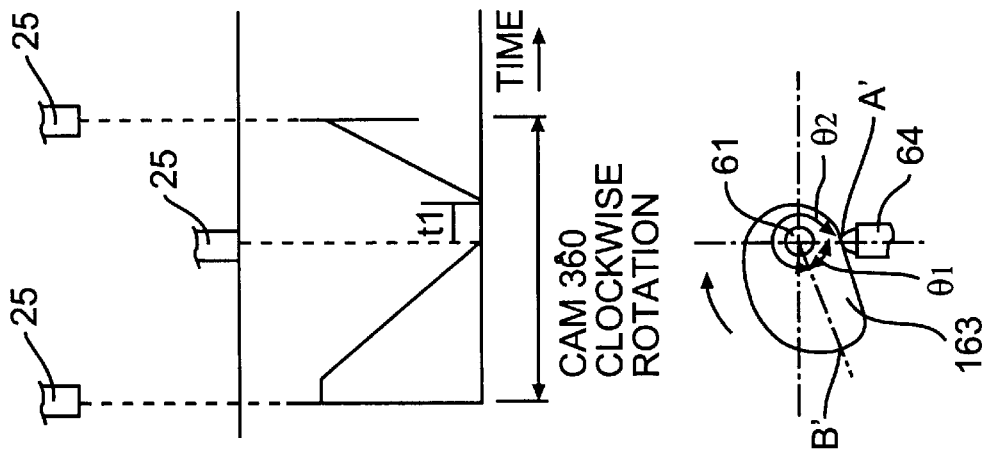
FIGS. 8A and 8B illustrate the relationship between the rotating direction of an eccentric cam and the vertical movement of a suction bit in a modified example of the eccentric cam.
Figure 8A:
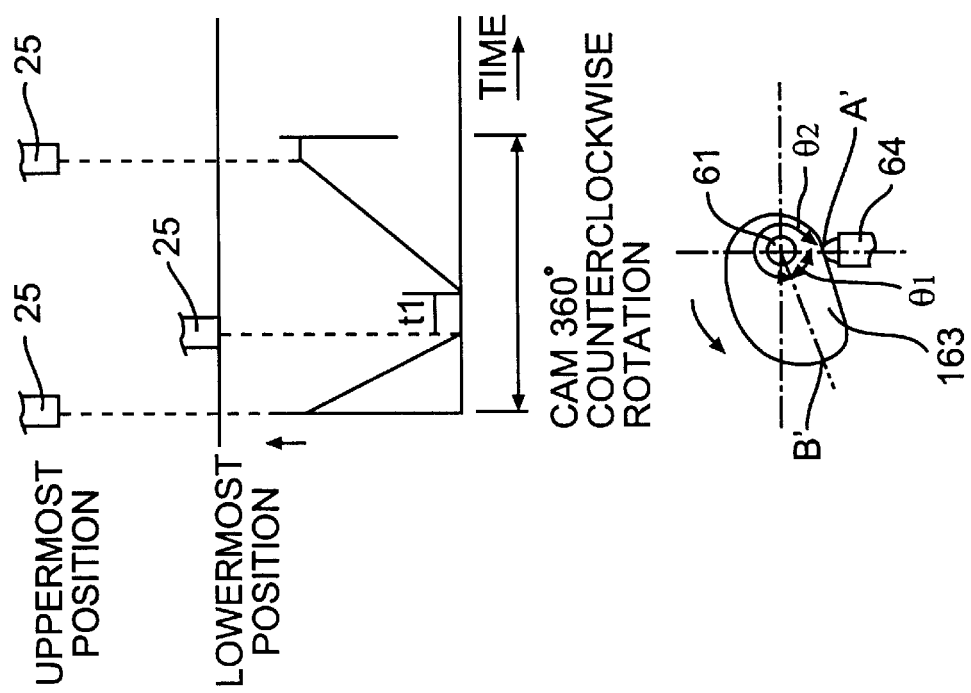

FIGS. 8A and 8B illustrate a modified example of the eccentric cam. For simplification, elements corresponding to those shown in earlier figures are designated by the same reference numerals.

In this example, eccentric cam 163 has a minimum diameter portion A' for placing suction bit 25 at its uppermost position, a maximum diameter portion B' for placing suction bit 25 at its lowermost position, and rapid and slow moving areas $\theta_1$ and $\theta_2$, respectively, positioned between the minimum diameter portion A' and the maximum diameter portion B'.

When eccentric cam 163 rotates counterclockwise, follower 64 makes contact with the rapid moving area $\theta_1$ and then the slow moving area $\theta_2$. When the eccentric cam 163 rotates clockwise, on the other hand, follower 64 contacts the slow moving area $\theta_2$ and then the rapid moving area $\theta_1$. The rapid moving area $\theta_1$ has a smaller central angle than the slow moving area $\theta_2$.

FIG. 8A shows eccentric cam 163 rotating 360° counterclockwise to move suction bit 25 up and down by lowering piston rod 45. In this case, when follower 64 contacts the minimum diameter portion A', suction bit 25 is located at the uppermost position. Then, as eccentric cam 163 rotates counterclockwise, follower 64 first contacts the cam surface of the rapid moving area $\theta_1$ and then moves downward. When follower 64 reaches the maximum diameter portion B', suction bit 25 is located at the lowermost position.

Eccentric cam 163 is designed to have a cam surface that has a predetermined range with a radius from the rotation center of supporting shaft 61 equal to the radius of the maximum diameter portion B'. As a result, suction bit 25 remains at the lowermost position for a predetermined period of time $t_1$. As eccentric cam 163 continues to rotate in the same direction, follower 64 makes contact with the cam surface of the slow moving area $\theta_2$. In response to the radius variation in slow moving area $\theta_2$, suction bit 25 returns to its uppermost position.

Because the rapid moving area $\theta_1$ and the slow moving area $\theta_2$ have different central angles, follower 64 moves rapidly from the uppermost position to the lowermost position, and slowly from the lowermost position to the uppermost position.

FIG. 8B shows the situation when eccentric cam 163 rotates clockwise by 360°. As eccentric cam 163 rotates clockwise, follower 64 moves down along the slow moving area $\theta_2$ until it contacts the range having the radius equal to the radius of the maximum diameter portion B'. As a result, suction bit 25 slowly moves to the lowermost position and pauses for a predetermined period of time $t_1$, while follower 64 traverses the range. As eccentric cam 163 continues to rotate in the same direction, follower 64 moves up faster than it moved down.

As suggested by the graphs of FIGS. 8A and 8B, the configuration of the cam surface, that is, the contour of the rapid moving area and the slow moving area, can be modified.

When picking up the electronic component W from component stage 23, suction bit 25 preferably moves rapidly downward and toward the component and then moves rather slowly upward after picking up the component. This enables suction bit 25 to efficiently pick up the component while reducing any chance of fall-off.

When mounting the electronic component W held by suction bit 25, on the other hand, suction bit 25 preferably moves slowly downward and then moves rapidly upward after mounting the component. This enables suction bit 25 to accurately mount the component on printed circuit board 20 while reducing the chances of fall-off and damage to the component.

Therefore, as shown in FIGS. 8A and 8B, the counterclockwise and clockwise rotations of eccentric cam 163 allows the electronic component to be efficiently mounted without fall-off by moving suction bit 25 up and down at different speeds.

The rotation directions of eccentric cams 63 and 163 (FIGS. 3 and 8) may be set arbitrarily. For example, a component may be picked up by the suction bit when the piston rod causes the rack member to move upward, and mounted when the rack member moves downward. Additionally, the described vertical arrangement of the rack member for achieving its vertical linear movement may be replaced by a horizontal arrangement for horizontal linear movement.

While the eccentric cam has been described as rotating once, or by 360°, clockwise or counterclockwise from the linear movement of the rack member in one direction in the present invention, the rotation degree of the eccentric cam is not limited to 360°, and can be varied by properly designing the surface shape of the eccentric cam. For example, the same results as those described above can be achieved by designing the surface shape of the eccentric cam to rotate the eccentric cam at 180° clockwise or counterclockwise from the linear movement of the rack member in one direction, thereby moving the suction bit once downward and once upward as the eccentric cam rotates at 180° in one direction.

While the rack member has been described as the means for rotating the eccentric cam counterclockwise or clockwise, this need not be the case. A motor, for example, can be used to rotate the eccentric cam.

The component mounting apparatus of the present invention can move the suction bit at a high speed because the suction bit moves up and down when the eccentric cam is rotated counterclockwise and clockwise by a predetermined degree. The time required to move the suction bit up and down can be adjusted and an optimum mounting pattern of the suction bit can be achieved by properly forming the configuration of the cam surface of the eccentric cam.

When the rack member rotates the eccentric cam to move the suction bit up and down by one-stroke advancement and one-stroke retreat, the following advantages are obtained:

(1) the suction bit can move up and down at a high speed without rapidly moving the rack member;

(2) because linear movement of the rack member results in vertical movement of the suction bit, several suction bits can be installed in a small area of the mounting head; and (3) the cost of manufacturing the component mounting apparatus decreases, compared with the cost of manufacturing a component mounting apparatus having an electric motor.

The foregoing description of preferred embodiments of the present invention provides illustration and description, but is not intended to be exhaustive or to limit the invention to the precise form disclosed. Modifications and variations are possible in light of the above teachings or may be acquired from practice of the invention. The scope of the invention is defined by the claims and their equivalents.

What is claimed is:

1. A component mounting apparatus for mounting a component from a component stage on a printed circuit board, comprising:

a mounting head movably connected between said component stage and said printed circuit board;

a holder connected to said mounting head;

a suction bit, connected to said holder, for picking up said component;

an eccentric cam rotatably connected to said holder;

a rack member connected to move linearly with respect to said holder, linear movement of said rack member causing said eccentric cam to rotate by a predetermined degree; and a follower, connected to said suction bit and contacting a surface of said eccentric cam, for moving said suction bit up and down when said eccentric cam is rotated by the predetermined degree by said rack member.

2. The component mounting apparatus as claimed in claim 1, wherein said follower includes means for moving said suction bit between an uppermost position and a lowermost position in response to rotation of said eccentric cam by said predetermined degree; and wherein said eccentric cam surface has a shape designed so that an upward-movement speed of said suction bit is different from a downward-movement speed of said suction bit.

3. The component mounting apparatus as claimed in claim 1, wherein said predetermined degree is 360°.

4. The component mounting apparatus as claimed in claim 1, wherein said predetermined degree is 180°.

5. The component mounting apparatus as claimed in claim 1, further comprising holder moving means for moving said holder up and down to vary a vertical movement range of said suction bit.

6. The component mounting apparatus as claimed in claim 1, further comprising suction bit rotating means for rotating said suction bit.

7. In a component mounting apparatus for mounting a component from a component stage on a printed circuit board, having a mounting head movably connected between the component stage and the printed circuit board, a holder connected to the mounting head, a suction bit, connected to the holder, for picking up the component, and a cam device connected to the holder, the cam device comprising:

an eccentric cam rotatably connected to the holder;

a rack member connected to move linearly with respect to the holder, linear movement of the rack member causing the eccentric cam to rotate by a predetermined degree; and a follower, connected to the suction bit and contacting a surface of the eccentric cam, for moving the suction bit up and down when the eccentric cam is rotated by the predetermined degree by the rack member.

8. The cam device of claim 7, wherein the follower includes means for moving the suction bit between an uppermost position and a lowermost position in response to rotation of the eccentric cam by the predetermined degree; and wherein the eccentric cam surface has a shape designed so that an upward-movement speed of the suction bit is different from a downward-movement speed of the suction bit.

9. The cam device of claim 7, wherein the predetermined degree is 360°.

10. The cam device of claim 7, wherein the predetermined degree is 180°.

* * * * *